(12) United States Patent
Lee et al.

(10) Patent No.: US 8,386,858 B2
(45) Date of Patent: Feb. 26, 2013

(54) SEMICONDUCTOR MEMORY DEVICE

(75) Inventors: Jeong-Hun Lee, Gyeonggi-do (KR); Jeong-Tae Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 112 days.

(21) Appl. No.: 12/616,529

(22) Filed: Nov. 11, 2009

(65) Prior Publication Data

US 2011/0004794 A1    Jan. 6, 2011

(30) Foreign Application Priority Data

Jul. 3, 2009   (KR) ................. 10-2009-0060636

(51) Int. Cl.
G11C 29/00    (2006.01)
G11C 7/00    (2006.01)

(52) U.S. Cl. .................... 714/718; 365/201

(58) Field of Classification Search .............. None
See application file for complete search history.

(56) References Cited

U.S. PATENT DOCUMENTS

| | | | | |
|---|---|---|---|---|
| 6,343,048 B1* | 1/2002 | Jung | ................. | 365/189.16 |
| 6,771,558 B2* | 8/2004 | Kim | ................. | 365/233.18 |
| 6,912,169 B2* | 6/2005 | Choi | ................. | 365/222 |
| 6,924,685 B2* | 8/2005 | Bae | ................. | 327/276 |
| 6,996,753 B2* | 2/2006 | Cho | ................. | 714/718 |
| 2001/0050870 A1* | 12/2001 | Koshikawa | ................. | 365/201 |
| 2001/0054164 A1* | 12/2001 | Tanizaki et al. | ................. | 714/718 |
| 2002/0080668 A1* | 6/2002 | Brown et al. | ................. | 365/201 |
| 2002/0163850 A1* | 11/2002 | Song | ................. | 365/233 |
| 2002/0167859 A1* | 11/2002 | Chun | ................. | 365/233 |
| 2003/0031082 A1* | 2/2003 | Sawada | ................. | 365/233 |
| 2003/0085731 A1* | 5/2003 | Iwase et al. | ................. | 326/16 |
| 2003/0126529 A1* | 7/2003 | Cho | ................. | 714/720 |
| 2004/0190355 A1* | 9/2004 | Koga et al. | ................. | 365/201 |
| 2005/0254333 A1* | 11/2005 | Do | ................. | 365/230.08 |
| 2008/0031058 A1* | 2/2008 | Do | ................. | 365/189.09 |
| 2008/0031059 A1* | 2/2008 | Do | ................. | 365/189.09 |

FOREIGN PATENT DOCUMENTS

| | | |
|---|---|---|
| KR | 1020020085038 | 11/2002 |
| KR | 1020080100100 | 11/2008 |

OTHER PUBLICATIONS

Notice of Allowance issued from Korean Intellectual Property Office on Apr. 29, 2011.

* cited by examiner

Primary Examiner — Guerrier Merant
(74) Attorney, Agent, or Firm — IP & T Group LLP

(57) ABSTRACT

A semiconductor memory device is capable of performing a test operation in its various operation modes. Particularly, the semiconductor memory device can enter a test mode in other modes, as well as, an all bank pre-charge mode. The semiconductor memory device includes a test mode control block configured to generate a test signal enabled for a predetermined interval in an active mode, and a mode register set control block configured to enable a mode register set signal for a test operation in the predetermined interval in response to the test signal.

9 Claims, 5 Drawing Sheets

SEMICONDUCTOR MEMORY DEVICE

CROSS-REFERENCE TO RELATED APPLICATIONS

The present application claims priority of Korean Patent Application No. 10-2009-0060636, filed on Jul. 3, 2009, which is incorporated herein by reference in its entirety.

BACKGROUND OF THE INVENTION

Exemplary embodiments of the present invention relate to a semiconductor memory device, and more particularly, to a test operation of a synchronous semiconductor memory device.

As a manufacturing process and a design technology of semiconductor memory devices develop, the semiconductor memory devices can have comparatively large memory capacity. Also, the semiconductor memory devices can increase its operating speed. For instance, a synchronous semiconductor memory device is developed to match its data accessing speed with an operating speed of a system which it belongs to. As the synchronous semiconductor memory device inputs/outputs data in synchronization with a system clock, provided by the system, such as a central processing unit, its operating speed also increases.

The synchronous semiconductor memory device inputs pulse type command signals. The synchronous semiconductor memory device decodes inputted command signals to perform internally predetermined operations in response to decoded signals. The synchronous semiconductor memory device generally inputs the command signals, such as a chip selecting signal /CS, a column address strobe (CAS) signal /CAS, a row address strobe (RAS) signal /RAS, a write enable signal /WE, a clock enable signal CKE, and a clock signal CLK.

As the data accessing speed of the synchronous semiconductor memory device increases and it has larger memory capacity, a test operation for testing the synchronous semiconductor memory device becomes more critical. Some synchronous semiconductor memory devices recently developed perform a test operation under plural restrictions. For instance, all banks of the synchronous semiconductor memory device must be in a pre-charge mode to enter a test mode. Accordingly, there is a need to develop a synchronous semiconductor memory device capable of performing a test operation in any operation mode.

SUMMARY OF THE INVENTION

An embodiment of the present invention is directed to a semiconductor memory device capable of performing a test operation in its various operation modes. Particularly, the semiconductor memory device can enter a test mode in other modes, as well as, an all bank pre-charge mode.

In accordance with an embodiment of the present invention, a semiconductor memory device includes a test mode control block configured to generate a test signal enabled for a predetermined interval in an active mode, and a mode register set control block configured to enable a mode register set signal for a test operation in the predetermined interval in response to the test signal.

The test mode control block enables the test signal in response to a clock enabling signal in the active mode.

The test mode control block includes a test mode entry signal input unit configured to transfer a test mode entry signal inputted through an input path for a clock enabling signal, a test mode exit signal input unit configured to transfer a test mode exit signal, and a test mode interval setting unit configured to enable the test signal in response to the test mode entry signal and disable the test signal in response to the test mode exit signal.

The test mode entry signal input unit receives the clock enabling signal and a test mode signal indicating an entry to a test mode at an all bank pre-charge state.

The mode register set control block includes a mode register set signal enabling unit configured to generate an enabling signal in the test signal and an idle signal enabled at the all bank pre-charge state, a mode register set signal generating unit enabled by the enabling signal and configured to generate the mode register set signal in response to an internal chip selecting signal, an internal RAS signal, an internal CAS signal, and a write signal, and a mode register set signal outputting unit configured to output the mode register set signal in synchronization with an internal clock signal.

The mode register set signal generating unit includes a first signal input circuit configured to combine the internal chip selecting signal with the internal RAS signal by being enabled in response to the enabling signal, a second signal input circuit configured to combine the internal CAS signal with the write signal, and a mode register set signal combination circuit configured to combine outputs of the first and the second signal input circuits.

The test mode exit signal includes a burst stop signal.

In accordance with another embodiment of the present invention, there is provided a method of testing a semiconductor memory device having a test mode, which includes entering the test mode in an all bank pre-charge mode, entering an active mode, enabling a test signal, in the active mode, by inputting a test mode entry signal to the semiconductor memory device through an input path which a clock enable signal is inputted through, disabling the test signal in response to a test mode exit signal, and enabling a mode register set signal in an enablement interval of the test signal.

The test mode exit signal includes a burst stop signal.

DESCRIPTION OF SPECIFIC EMBODIMENTS

Figure 1:
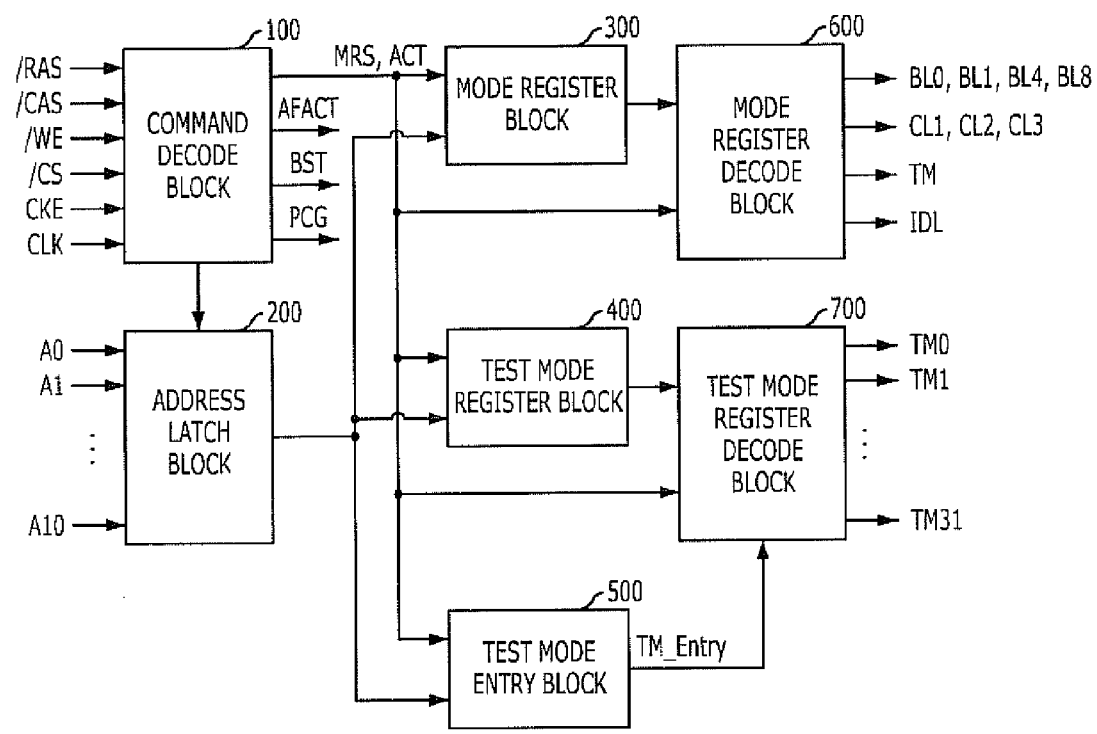
FIG. 1 is a block diagram illustrating a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the prevent invention.

In order to improve the efficiency of a testing operation, a semiconductor memory device of the present invention can control a timing point of testing its characteristics. That is, a point for appropriately screening the semiconductor memory device can be adjusted so as to enter its test mode. As the semiconductor memory device can enter its test mode in an active mode, it is possible to test the semiconductor memory device in its active state.

Compared with a prior art wherein it enters a test mode only in an all bank pre-charge mode, a semiconductor memory device of the present invention can enter its test mode even in its active mode. That is, the semiconductor memory device can enter its test mode in both the active mode and the all bank pre-charge mode.

FIG. 1 is a block diagram illustrating a semiconductor memory device in accordance with an embodiment of the present invention. Referring to FIG. 1, the semiconductor memory device includes a command decode block 100, an address latch block 200, a mode register block 300, a test mode register block 400, a test mode entry block 500, a mode register decode block 600, and a test mode register decode block 700.

The command decode block 100 decodes a chip selecting signal /CS, a column address strobe (CAS) signal /CAS, a row address strobe (RAS) signal /RAS, a write enable signal /WE, a clock enable signal CKE, and a clock signal CLK to output signals defining internal operations such as a mode register set signal MRS, an active signal ACT, and a signal controlling a signal input timing of the address latch block 200. The address latch block 200 receives address signals A0-A10 to transfer them into other internal blocks.

The mode register block 300 controls the mode register decode block 600 in response to an output of the command decode block 100 as an internal register of the semiconductor memory device. The test mode register block 400 controls the test mode register decode block 700 in response to output signals of the address latch block 200 and the command decode block 100. The test mode entry block 500 generates a test mode entry signal TM_entry in response to the output signals of the address latch block 200 and the command decode block 100.

The mode register decode block 600 generates control signals for various states of the semiconductor memory device under the control of the mode register block 300. For example, the mode register decode block 600 generates burst length signals BL0, BL1, BL4, and BL8, cas latency signals CL1-CL3, a test signal TM, and an idle signal IDL. The test signal TM is a reference signal in the test mode, and the idle signal IDL is activated in the all bank pre-charge mode.

Figure 2:
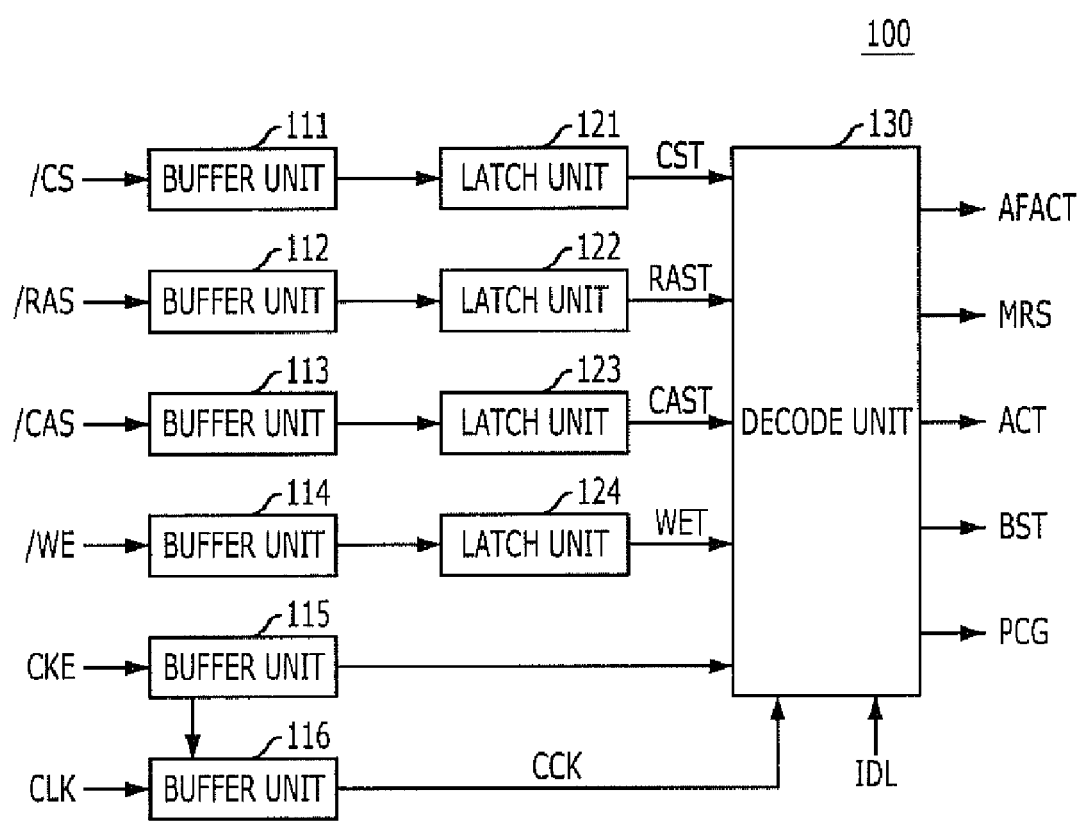
FIG. 2 is a block diagram illustrating a command decode unit shown in FIG. 1.

FIG. 2 is a block diagram illustrating the command decode block 100 shown in FIG. 1. Referring to FIG. 2, the command decode block 100 includes buffer units 111-116, latch units 121-124, and a decode unit 130.

A first buffer unit 111 buffers the chip selecting signal /CS and a first latch unit 121 latches an output of the first buffer unit 111 to output an internal chip selecting signal CST. A second buffer unit 112 buffers the RAS signal /RAS and a second latch unit 122 latches an output of the second buffer unit 112 to output an internal RAS signal RAST. A third buffer unit 113 buffers the CAS signal /CAS and a third latch unit 123 latches an output of the third buffer unit 113 to output an internal CAS signal CAST. A fourth buffer unit 114 buffers the write enable signal /WE and a fourth latch unit 124 latches an output of the fourth buffer unit 114 to output a write signal WET.

A fifth buffer unit 115 controls a sixth buffer unit 116 in response to the clock enable signal CKE. In response to an output of the fifth buffer unit 115, the other buffer units and the decode unit 130 are enabled. The sixth buffer unit 116 receives the clock signal CLK and transfers an internal clock signal CCK to the decode unit 130.

The decode unit 130 receives the internal chip selecting signal CST, the internal RAS signal RAST, the internal CAS signal CAST, the write signal WET, the idle signal IDL, and the internal clock signal CCK to output a refresh signal AFACT, a mode register set signal MRS, an active signal ACT, a burst stop signal BST, and a pre-charge signal PCG. The refresh signal AFACT is for a refresh operation of the semiconductor memory device. The mode register set signal MRS is for setting a mode register value of the semiconductor memory device and for processing its test signal. The active signal ACT and the pre-charge signal PCG are for an active operation and a pre-charge operation of the semiconductor memory device, respectively. The burst stop signal BST is for stopping a burst mode operation.

Figure 3:
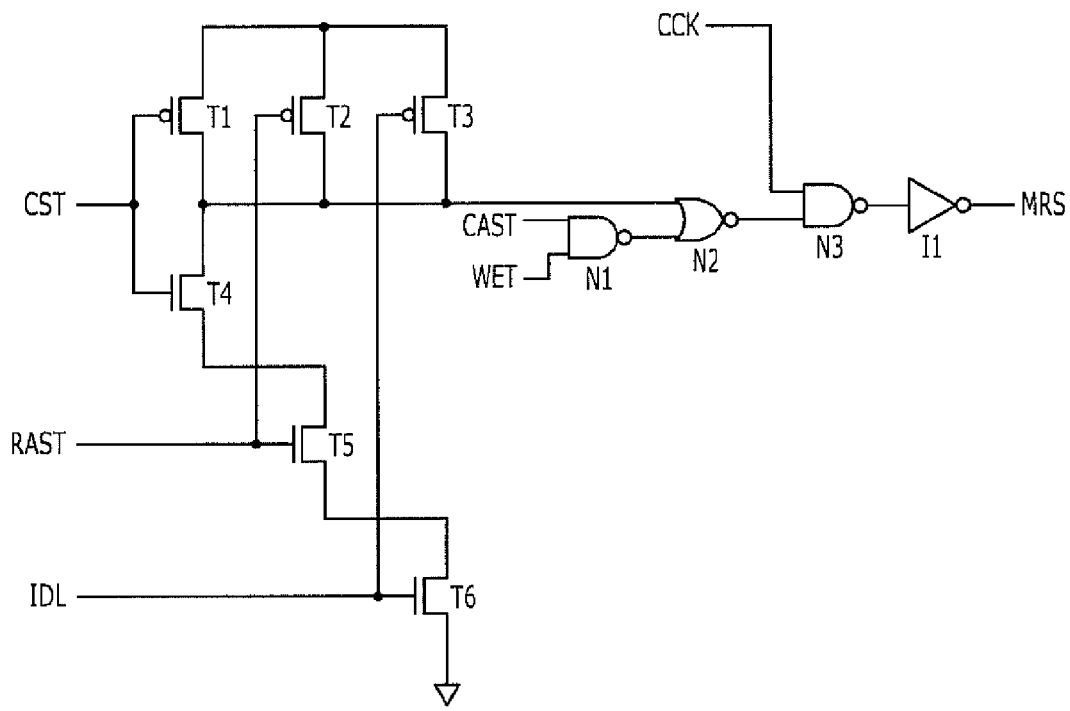
FIG. 3 illustrates a schematic circuit diagram for generating the mode register set signal in a decode unit of FIG. 2.

FIG. 3 illustrates a schematic circuit diagram for generating the mode register set signal MRS in the decode unit 130 of FIG. 2.

The circuit of FIG. 3, i.e., a mode register set signal generating circuit, includes MOS transistors T1 to T6, an inverter I1, a NOR gate N2, and NAND gates N1 and N3. The mode register set signal generating circuit receives the internal chip selecting signal CST, the internal RAS signal RAST, the internal CAS signal CAST, the write signal WET, the idle signal IDL, and the internal clock signal CCK to output the mode register set signal MRS.

The mode register set signal MRS is used for the semiconductor memory device to enter a test mode. When the mode register set signal MRS is enabled, the semiconductor memory device enters the test mode if an address signal A<7> is enabled to high logic level. After the entry to the test mode, signals for test operations are inputted into the semiconductor memory device through input paths of address signals, thereby performing the test operations to improve the semiconductor memory device. Accordingly, each test operation may be repeatedly performed by using various test patterns to detect an appropriate point for screening the semiconductor memory device.

In the mode register set signal generating circuit of FIG. 3, under a condition of high logic level of the idle signal IDL, the mode register set signal MRS is enabled to a high logic level when the internal chip selecting signal CST, the internal RAS signal RAST, the internal CAS signal CAST, and the write signal WET are inputted in a high logic level. The internal chip selecting signal CST and the internal RAS signal RAST can be transferred to the NOR gate N2 only under the condition of high logic level of the idle signal IDL. Herein, the idle signal IDL is a signal enabled in an all bank pre-charge mode.

According to the mode register set signal generating circuit of FIG. 3, the semiconductor memory device enters the test mode only in the all bank pre-charge mode. The semiconductor memory device can not enter the test mode in its active state. Therefore, it puts lots of limitations on testing the semiconductor memory device.

In accordance with the embodiment of the present invention, a semiconductor memory device is capable of entering a test mode in its active state. For this, a clock enabling signal CKE is used. The semiconductor may enter a power down mode by the clock enabling signal CKE synchronized with a clock signal CLK. Accordingly, being asynchronous with the clock signal CLK, the clock enabling signal CKE with a comparatively narrow pulse width is inputted to the semiconductor memory device. The semiconductor memory device enters the test mode in response to the clock enabling signal CKE and performs a corresponding test operation. It can be free from the test mode, that is, re-operate in its active state by using any other signals inputted through usable I/O pins.

Figure 4:
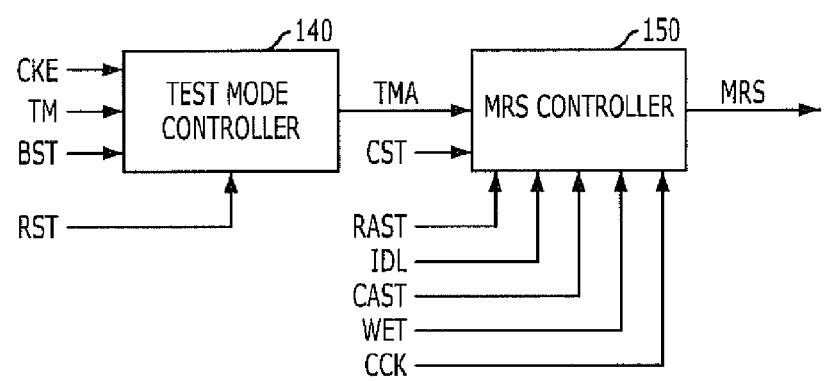
FIG. 4 is block diagram illustrating a mode register set signal generating unit in accordance with an embodiment of the present invention.

FIG. 4 is block diagram illustrating a mode register set signal generating unit in accordance with an embodiment of the present invention. Referring to FIG. 4, a mode register set signal generating unit includes a test mode controller 140 and a mode register set (MRS) controller 150.

The test mode controller 140 receives a clock enable signal CKE, a test mode signal TM, a burst stop signal BST, and a reset signal RST to output a test signal TMA. The MRS controller 150 receives the test signal TMA, an internal chip selecting signal CST, an internal RAS signal RAST, an internal CAS signal CAST, a write signal WET, an idle signal IDL, and an internal clock signal CCK to output a mode register set signal MRS.

Figure 5:
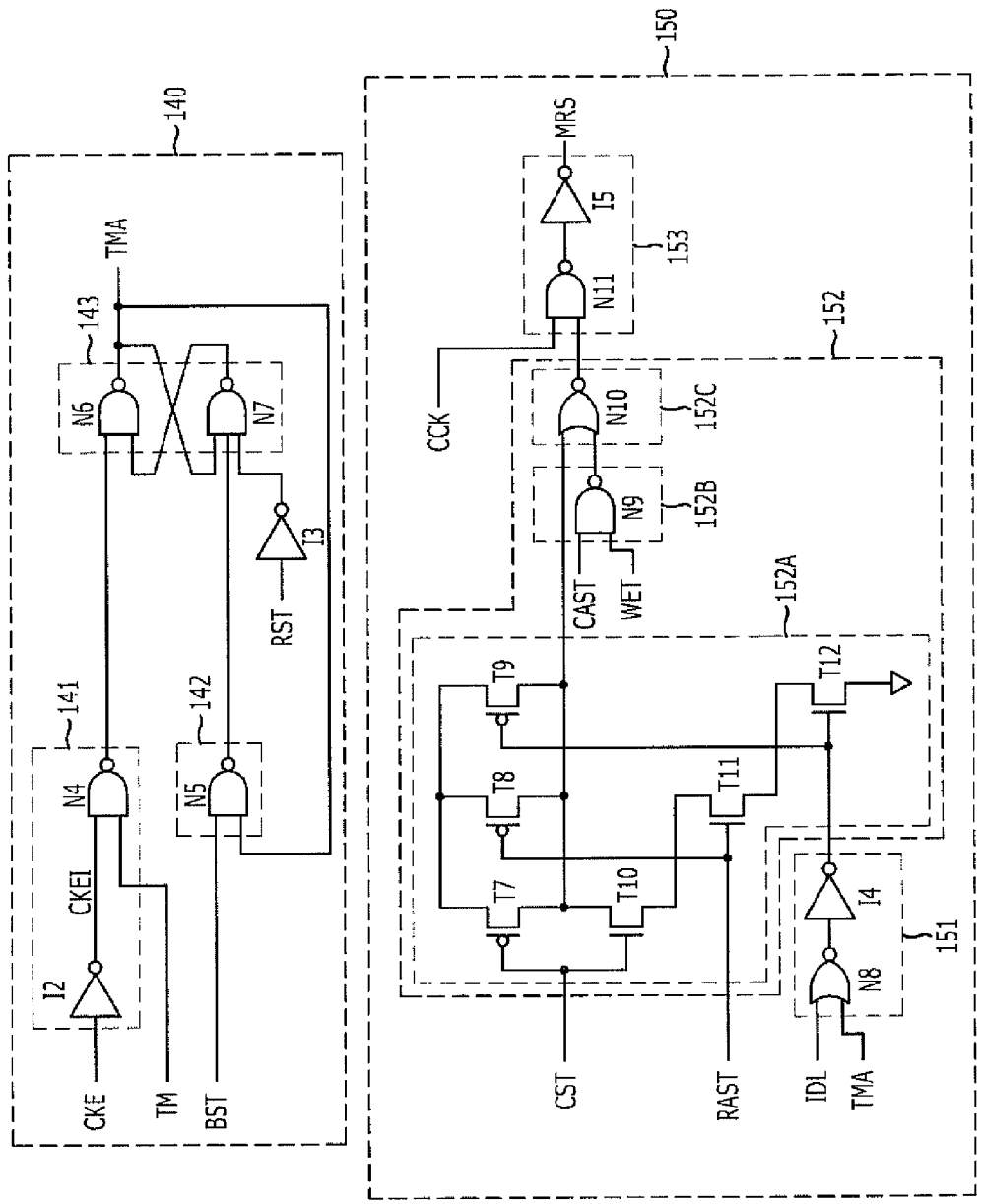
FIG. 5 is a schematic circuit diagram illustrating the mode register set signal generating unit shown in FIG. 4.

FIG. 5 is a schematic circuit diagram illustrating the mode register set signal generating unit shown in FIG. 4. Referring to FIG. 5, the test mode controller 140 includes a test mode entry signal input circuit 141, a test mode exit signal input circuit 142, and a test mode interval setting circuit 143.

The test mode entry signal input circuit 141 includes an inverter I2 inverting the clock enable signal CKE, and a NAND gate N4 performing a logic operation on the test mode signal TM and an output of the inverter I2. The test mode exit signal input circuit 142 includes a NAND gate N5 performing a logic operation on the burst stop signal BST and the test signal TMA. The test mode interval setting circuit 143 includes NAND gates N6 and N7 receiving outputs of the test mode entry signals input circuit 141 and the test mode exit signal input circuit 142, respectively. The NAND gates N6 and N7 are cross-coupled with each other to output the test signal TMA.

The test mode controller 140 may further include an inverter I3 which inverts the reset signal RST to an inverted signal to the test mode interval setting circuit 143. The reset signal is for resetting the test mode interval setting circuit 143.

The test mode controller 140 enables the test signal TMA in a high logic level in response to the clock enabling signal CKE and disables it in a low logic level in response to the burst stop signal BST. Meanwhile, as well as, the clock enabling signal CKE and the burst stop signal BST in this embodiment, other signals can be used.

The MRS controller 150 includes a MRS signal enabling circuit 151, a MRS signal generating circuit 152, and a MRS signal outputting circuit 153. The MRS signal enabling circuit 151 includes a NOR gate N8 performing a logic operation on the idle signal IDL and the test signal TMA, and an inverter I4 inverting an output of the NOR gate N8.

The MRS signal generating circuit 152 includes a first signal input circuit 152A and a second signal input circuit 152B, and a MRS signal combination circuit 152C. The first signal input circuit 152A includes MOS transistors T7 to T12 to receive the internal chip selecting signal CST and the internal RAS signal RAST. The second signal input circuit 152B includes a NAND gate N9 performing a logic operation on the internal CAS signal CAST and the write signal WET. The MRS signal combination circuit 152C includes a NOR gate N10 performing a logic operation on outputs of the first and second signal input circuits 152A and 152B.

The MRS signal outputting circuit 153 includes a NAND gate N11 and an inverter I5. The NAND gate N11 performs a logic operation on the internal clock signal CCK and an output of the MRS signal generating circuit 152. The inverter I5 inverts an output of the NAND gate N11 to output the mode register set signal MRS.

The mode register set signal generating unit of FIG. 5 latches the clock enabling signal CKE, which is generated in a pulse type for the test operation, to enable the mode register set signal MRS. Herein, the clock enabling signal CKE, as a pulse type of signal, is inputted from the outside of the semiconductor memory device to test it. The input timing of the clock enabling signal CKE can be controlled for the semiconductor memory device not to enter a power down mode.

The test mode controller 140 combines the clock enabling signal CKE with the test mode signal TM enabled at the entry to the test mode to enable the test signal TMA, which is outputted to the MRS controller 150. The MRS controller 150 can enable the mode register set signal MRS by combining input signals (CST, RAST, CAST, and WET) in response to the test signal TMA, regardless of enablement of the idle signal IDL. When the mode register set signal MRS is enabled, various signals testing the semiconductor memory device can be inputted to the semiconductor memory device from the outside thereof. That is, the semiconductor memory device can be tested in responses to the test signal TMA as well as the idle signal IDL. The semiconductor memory device enters the test mode in its all bank pre-charge state and receives testing signals, and it can receive the testing signals again when being in its active state.

In the prior art, the mode register set signal MRS is enabled in relation to the test mode for improving the performance of the semiconductor memory device, which can be enabled only in the all bank pre-charge mode. The semiconductor memory device in accordance with the embodiment of the present invention not only enters the test mode as in the prior art (that is, enables the mode register set signal MRS in the all bank pre-charge mode), but also enables the mode register set signal MRS in the active mode. The semiconductor memory device can perform various test operations in its active state, and the appropriate point of screening the semiconductor memory device can be detected to improve efficiency at the test mode. Therefore, it improves the performance of the semiconductor memory device.

At testing a comparatively low speed of operation in a wafer level, data for various tests can be inputted to the semiconductor memory device by inputting the clock enable signal CKE being asynchronous with the clock signal CLK thereto and generating the mode register set signal MRS. Among the various tests, there are, for example, the level trimming of a high voltage VPP or a driving voltage, such as a core voltage VCORE, which can be performed to observe the characteristics of the semiconductor memory device.

Figure 6:
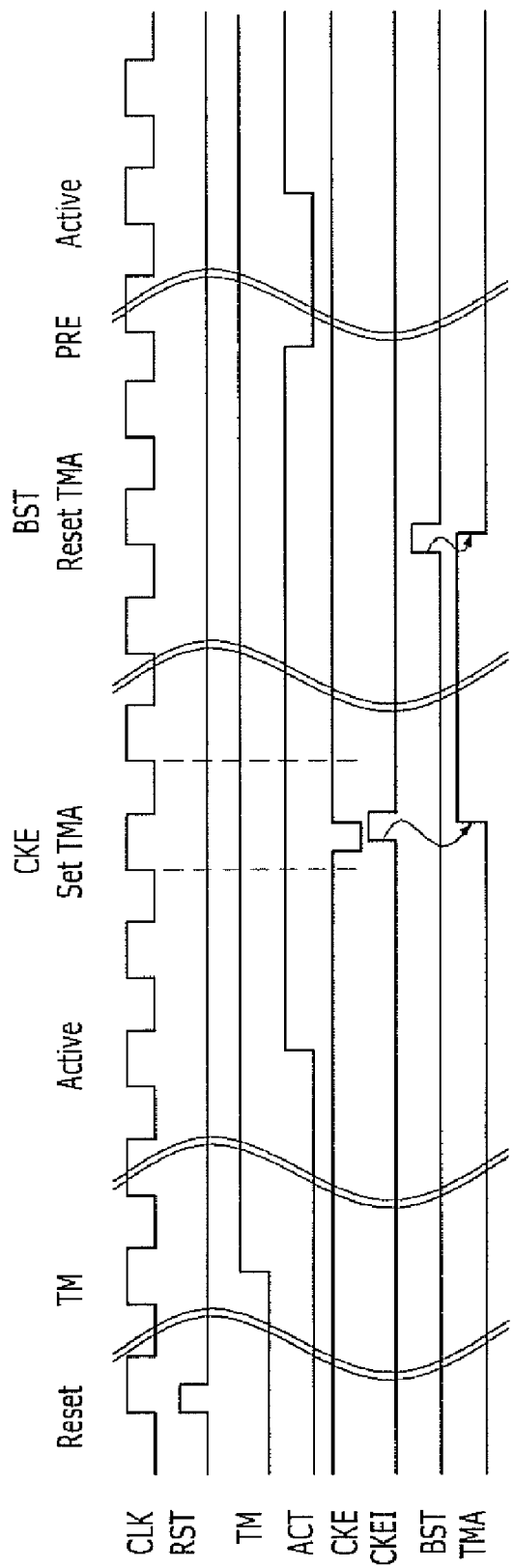
FIG. 6 is a signal timing diagram illustrating the operation of the mode register set signal generating unit shown in FIG. 5.

FIG. 6 is a signal timing diagram illustrating the operation of the mode register set signal generating unit shown in FIG. 5.

The semiconductor memory device of FIG. 6 enters the test mode from the reset mode. It is the entry to the test mode in the all bank pre-charge state of the semiconductor memory device, which is the same as in the prior art. At this time, the test mode signal TM is enabled to a high logic level.

After the semiconductor memory device enters the active mode, the test signal TMA is enabled to a high logic level if the clock enable signal CKE is inputted in pulse type (Referring to the section of CKE set TMA.). The test signal TMA is disabled again to a low logic level in response to the burst stop signal BST (Referring to the section of BST Reset TMA).

The section wherein the test signal TMA is enabled to a high logic level is in the active mode of the semiconductor memory device. Because the mode register signal can be enabled at any timing during the section, data related to the test operation can be inputted to the semiconductor memory device. After the test signal TMA is disabled to a low logic level, the semiconductor memory device may enter the pre-charge mode and the active mode in sequence as shown in FIG. 6.

In accordance with the embodiment of the present invention, the semiconductor memory device can enter the test mode to screen its critical section, wherein performance deterioration occurs, which is performed at the active state of the semiconductor memory device. Compared with entering the test mode only in the all bank pre-charge mode in the prior art, the semiconductor memory device of the embodiment of the present invention can enter the test mode even in the active mode. Thus, it improves efficiency of the test operation. As it becomes easy to detect a screen point of the performance deterioration, the period of developing the semiconductor memory device can be shortened.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a test mode control block configured to generate a test signal enabled for a predetermined interval period in an active mode; and
    a mode register set control block configured to enable a mode register set signal for a test operation in the predetermined interval period in response to the test signal and an idle signal enabled in an all bank pre-charge state.

2. The semiconductor memory device of claim 1, wherein the test mode control block enabled the test signal in response to a clock enabling signal in the active mode.

3. The semiconductor memory device of claim 1, wherein the test mode control block includes:
    a test mode entry signal input unit configured to transfer a test mode entry signal inputted through an input path for a clock enable signal;
    a test mode exit signal input unit configured to transfer a test mode exit signal; and
    a test mode interval setting unit configured to enable the test signal in response to the test mode entry signal and disable the test signal in response to the test mode exit signal.

4. The semiconductor memory device of claim 3, wherein the test mode entry signal input unit receives the clock enable signal and a test mode signal indicating an entry to a test mode in an all bank pre-charge state.

5. The semiconductor memory device of claim 1, wherein the mode register set control block includes:
    a mode register set signal enabling unit configured to generate an enable signal in response to the test signal and an the idle signal enabled in the all bank pre-charge state;
    a mode register set signal generating unit enabled by the enable signal and configured to generate the mode register set signal in response to an internal chip selecting signal, an internal RAS signal, an internal CAS signal, and a write signal; and
    a mode register set signal outputting unit configured to output the mode register set signal in synchronization with an internal clock signal.

6. The semiconductor memory device of claim 5, wherein the mode register set signal generating unit includes:
    a first signal input circuit configured to combine the internal chip selecting signal with the internal RAS signal by being enabled in response to the enable signal;
    a second signal input circuit configured to combine the internal CAS signal with the write signal; and
    a mode register set signal combination circuit configured to combine outputs of the first and the second signal input circuits.

7. The semiconductor memory device of claim 3, wherein the test mode exit signal includes a burst stop signal.

8. A method of operating a semiconductor memory device having a test mode, comprising:
    entering the test mode in an all bank pre-charge mode;
    entering an active mode;
    enabling a test signal, in the active mode, by inputting a test mode entry signal to the semiconductor memory device through an input path which a clock enable signal is inputted through;
    disabling the test signal in response to a test mode exit signal; and
    enabling a mode register set signal for a test operation in an enablement interval of the test signal in response to the test signal and an idle signal enabled an all bank pre-charge state.

9. The method of claim 8, wherein the test mode exit signal includes a burst stop signal.

* * * * *